US012725667B2

(12) United States Patent
Huang

(10) Patent No.: US 12,725,667 B2
(45) Date of Patent: Sep. 1, 2026

(54) MEMORY DEVICE AND CONTROL METHOD THEREOF

(71) Applicant: Winbond Electronics Corp., Taichung City (TW)

(72) Inventor: Chung-Meng Huang, Hsin-Chu City (TW)

(73) Assignee: Winbond Electronics Corp., Taichung City (TW)

( * ) Notice: Subject to any disclaimer, the term of this patent is extended or adjusted under 35 U.S.C. 154(b) by 94 days.

(21) Appl. No.: 18/817,167

(22) Filed: Aug. 27, 2024

(65) Prior Publication Data

US 2025/0329399 A1 Oct. 23, 2025

(30) Foreign Application Priority Data

Apr. 18, 2024 (TW) ................................ 113114456

(51) Int. Cl.
*G11C 11/34* (2006.01)
*G11C 16/10* (2006.01)
*G11C 16/16* (2006.01)
*G11C 16/34* (2006.01)

(52) U.S. Cl.
CPC ........ *G11C 16/3472* (2013.01); *G11C 16/102* (2013.01); *G11C 16/16* (2013.01)

(58) Field of Classification Search
CPC .... G11C 16/3472; G11C 16/102; G11C 16/16
USPC .................................................... 365/185.22
See application file for complete search history.

(56) References Cited

U.S. PATENT DOCUMENTS 5,881,295 A * 3/1999 Iwata .................. G06F 11/1433 712/E9.007
5,963,477 A * 10/1999 Hung ..................... G11C 16/16 365/185.11
6,157,570 A * 12/2000 Nachumovsky ... G11C 16/0475 257/E27.103
6,618,291 B2 * 9/2003 Piersimoni ............ G11C 16/10 365/185.11
6,836,863 B2 * 12/2004 Tabata ................... G11C 29/52 365/201
6,856,551 B2 * 2/2005 Mokhlesi ........... G11C 16/0458 365/185.28
7,027,331 B2 * 4/2006 Piersimoni ............ G11C 16/16 365/185.11
7,050,343 B2 * 5/2006 Kumar ................... G11C 29/16 365/201

(Continued)

FOREIGN PATENT DOCUMENTS

CN 120833821 A * 10/2025 ......... G11C 16/0483
TW 202542903 A * 11/2025

*Primary Examiner* — Viet Q Nguyen
(74) *Attorney, Agent, or Firm* — JCIPRNET

(57) ABSTRACT

The disclosure provides a memory device and a control method thereof. The control method of the memory device includes: receiving an erase command and performing an erasing operation on a memory block; when a plurality of suspend events occurs during the erasing operation, counting a resume number of the resume events respectively corresponding to a plurality of suspend events or a suspend number of the suspend events; and during the erasing operation, performing a first soft-program operation on the memory block when the resume number or the suspend number is greater than or equal to a threshold value.

18 Claims, 3 Drawing Sheets

(56) References Cited

U.S. PATENT DOCUMENTS

| | | | | |
|---|---|---|---|---|
| 8,830,756 | B2 * | 9/2014 | Mu | G11C 16/10<br>365/185.22 |
| 8,947,958 | B2 * | 2/2015 | Mu | G11C 16/344<br>365/185.29 |
| 11,908,522 | B2 * | 2/2024 | Zhang | G11C 16/10 |
| 2020/0135283 | A1 * | 4/2020 | Park | G06F 3/0604 |
| 2021/0304821 | A1 * | 9/2021 | Nakai | G11C 16/26 |

* cited by examiner

MEMORY DEVICE AND CONTROL METHOD THEREOF

CROSS-REFERENCE TO RELATED APPLICATION

This application claims the priority benefit of Taiwan application serial no. 113114456, filed on Apr. 18, 2024. The entirety of the above-mentioned patent application is hereby incorporated by reference herein and made a part of this specification.

BACKGROUND

Technical Field

The disclosure relates to a memory device and a control method thereof, and in particular relates to a non-volatile memory device and a control method thereof.

Description of Related Art

In the erasing operation of a memory block of a memory device, over-erasing of the memory block may easily occur when the number of erasing cycles is too high. When a memory block has undergone an over-erasing phenomenon, performing a data reading operation to the memory block may result in reading incorrect data due to the leakage current generated by the over-erased memory cells, thereby reducing the reliability of the data in the memory device.

SUMMARY

A memory device and a control method thereof are provided in the disclosure to avoid the over-erasing phenomenon.

The control method of the memory device of the disclosure includes the following operation. An erase command is received and an erasing operation is performed on a memory block. When multiple suspend events occurs during the erasing operation, a resume number of multiple resume events respectively corresponding to the suspend events or a suspend number of the suspend events is counted. During the erasing operation, a first soft-program operation is performed on the memory block when the resume number or the suspend number is greater than or equal to a threshold value.

The memory device of the disclosure includes a memory block and a logic circuit. The logic circuit is coupled to the memory block. The logic circuit is configured to perform the following operation. An erase command is received and an erasing operation is performed on a memory block. When multiple suspend events occurs during the erasing operation, a resume number of multiple resume events respectively corresponding to the suspend events or a suspend number of the suspend events is counted. During the erasing operation, a first soft-program operation is performed on the memory block when the resume number or the suspend number is greater than or equal to a threshold value.

Based on the above, the memory device of the disclosure can count the suspend number or the resume number that occur in the memory block during the erasing operation, and perform the soft-program operation on the memory block when the suspend number or the resume number reaches or exceeds a predetermined threshold value to reduce the possibility of the over-erasing phenomenon in the memory block.

DETAILED DESCRIPTION OF DISCLOSED EMBODIMENTS

Figure 1:
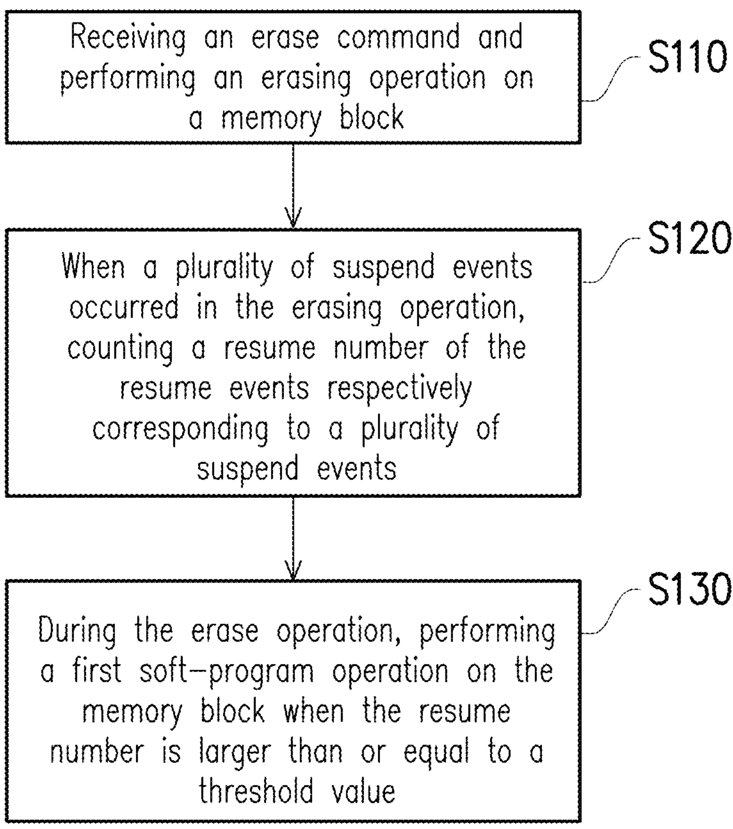
FIG. 1 is a flowchart of a control method of a memory device of an embodiment of the disclosure.

Referring to FIG. 1, FIG. 1 is a flowchart of a control method of a memory device of an embodiment of the disclosure. Among them, the control method of this embodiment is suitable for the erasing operation of the memory device. The memory device may be any form of non-volatile memory device. In step S110, the memory device may receive an erase command and perform an erasing operation on the memory block selected by the erase command. In step S120, when multiple suspend events occur during the erasing operation, the memory device may count the resume number of the resume events performed corresponding to the suspend events. Similarly, in step S130, during the aforementioned erasing operation, the memory device may determine whether the resume number is greater than or equal to a preset threshold value, and perform a soft-program operation on the selected memory block when the resume number is greater than or equal to the preset threshold value.

When the memory device performs the erasing operation of the memory block, it may be suspended due to usage requirements, thus generating a suspend event. When a suspend event is generated in the memory device, the erasing operation of the memory device needs to be suspended and the memory block restored to an accessible state. Then, when the access operation of the memory block is completed, the uncompleted erasing operation of the memory block needs to be resumed to continue the uncompleted erasing operation of the memory block.

If the erasing operation of the memory block is interrupted too many times, the over-erasing phenomenon of the memory block may occur. Therefore, in the embodiment of the disclosure, engineers can preset a threshold value. In this way, the memory device can calculate the resume number of the erasing operation of the memory block through step S120. The memory device compares the threshold value and the resume number, and performs an additional soft-program operation through step S130 when the resume number is greater than or equal to the threshold value to reduce the possibility of the over-erasing phenomenon in the memory block.

The memory block is, for example, a flash memory block. The memory device may have a logic circuit to perform a count operation for the resume number, a comparison operation between the resume number and a threshold value, and a control operation for performing a soft-program operation. The logic circuit can be a finite-state machine (FSM) circuit, or any other form of logic control circuit, without special limitations.

The memory block can also calculate the suspend number when a suspend event occurs during the erasing operation of the memory block, thereby obtaining the suspend number. The memory block can compare the set threshold value and the suspend number, and perform a soft-program operation on the memory block when the suspend number is greater than or equal to the threshold value to reduce the possibility of the over-erasing phenomenon in the memory block.

The above-mentioned soft-program operation provides an operation with relatively low programmed energy compared to a general program operation. For example, in a soft-program operation, the soft-program voltage provided may be lower than the programmed voltage for a general program operation. In addition, in the soft-program operation, the pulse width of the soft-program voltage provided can be shorter than the pulse width of the programmed voltage in the general program operation. Any form of soft-program operations well known to those of ordinary skill in the art can be applied to the embodiment of the disclosure without specific limitations.

Figure 2:
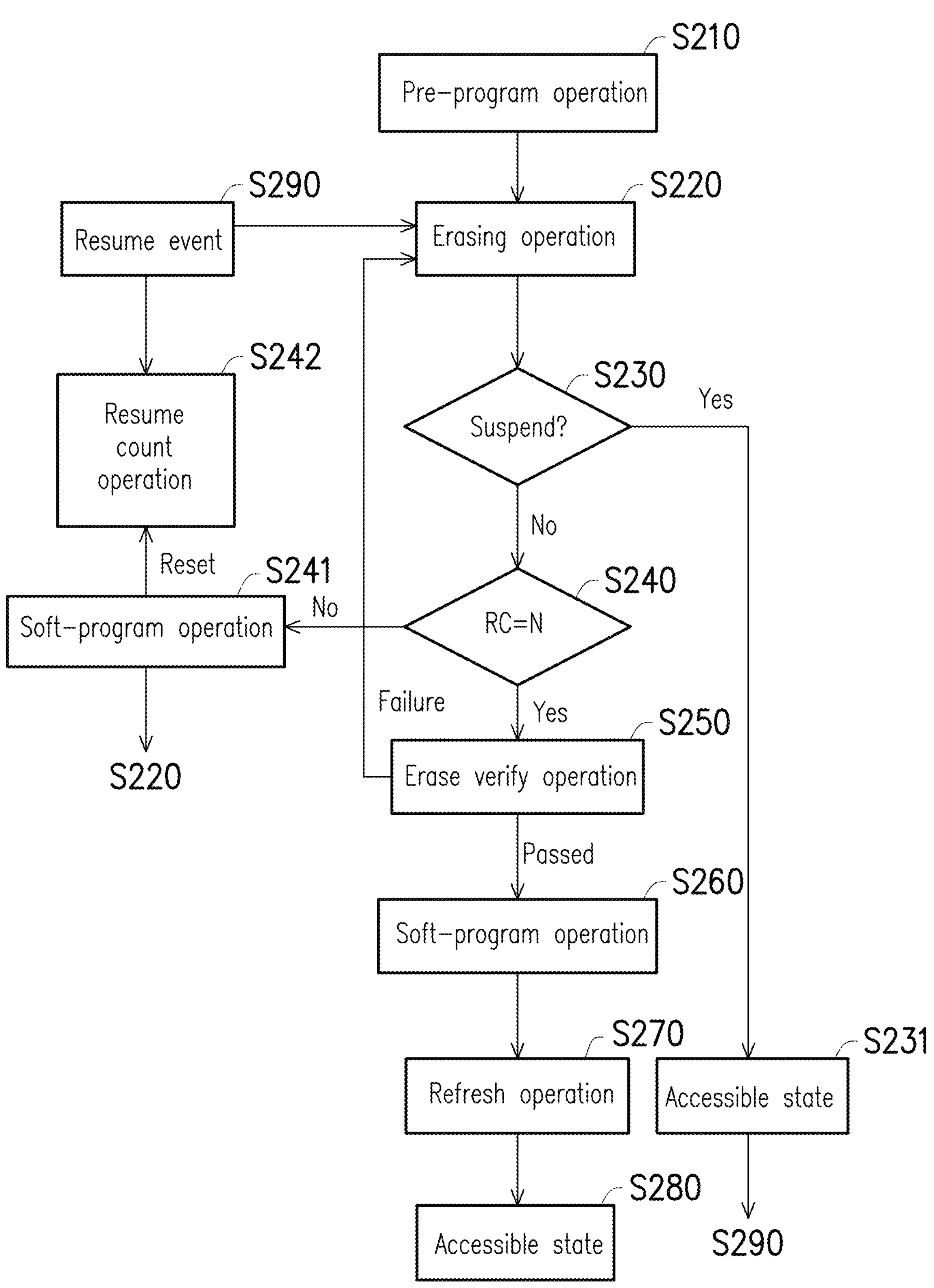
FIG. 2 is an operation flowchart of a control method of a memory device of another embodiment of the disclosure.

Referring to FIG. 2, FIG. 2 is an operation flowchart of a control method of a memory device of another embodiment of the disclosure. In step S210, the memory device may perform a pre-program operation on the selected memory block. Next, in step S220, the memory device may perform an erasing operation on the selected memory block. The erasing operation can be performed through any erasing method of non-volatile memory that is well known to those skilled in the art, without particular limitations.

In step S230, the memory device may determine whether a suspend command has been received and determine whether the erasing operation needs to be suspended. When the determination result in step S230 is yes, the memory device can stop the erasing operation of the memory block such that the memory block is in an accessible state (step S231). When the memory block is in an accessible state, the memory block can be provided to perform at least one of a data reading operation and a program operation. Since the erasing operation of the memory block is not completed, when the memory block does not need to provide access services, a resume event (step S290) may occur in the memory block to resume the erasing operation and leave the accessible state.

In addition, when the determination result of step S230 is no, the memory device can determine the relationship between the resume number RC of the resume event and the preset threshold value N. When the resume number RC is equal to the preset threshold value N, step S241 is performed; when the resume number RC is not equal to the preset threshold value N, step S250 may be performed. Please note here that the resume number RC may have an initial value of 0 when the erasing operation is initiated. On the other hand, after step S290 is performed, through step S242, the memory device may perform a resume count operation and increment the resume number RC by 1. The threshold value N is an integer greater than 0.

In step S240, when the resume number RC increases to equal to the threshold value N, it means that the number and suspend and resume events that have occurred in the memory block during this erasing operation has been too high, and the soft-program operation of the memory block may be performed through step S241. Through the soft-program operation, the degree of erasure of the memory block can be reduced, and the possibility of the over-erasing phenomenon in the memory block may be reduced.

After the soft-program operation of step S241 is completed, step S210 can be entered to perform the uncompleted erasing operation, and the memory device can reset the resume number RC, so that, for example, the resume number RC is equal to 0. It is worth noting that the resume number RC in this embodiment can be incremented from an initial value of 0, and when the resume number RC is equal to N, it is reset to 0 corresponding to the completion of the soft-program operation. Therefore, the resume number RC does not exceed N.

On the other hand, if step S240 determines that the resume number RC is not equal to (i.e., less than) the threshold value N, step S250 may be executed to perform an erase verify operation of the memory block. The erase verify operation is used to verify whether the threshold voltage of the erased memory cell has reached a predetermined voltage value. Any erase verify operation well known to those of ordinary skill in the art can be applied to this embodiment of the disclosure without specific limitations.

When the verification result of the erase verify operation in step S250 is "failure", it means that the erasing operation of the memory block is not completed, and step S220 can be performed and the erasing operation can be continued. In contrast, when the verification result of the erase verify operation in step S250 is "passed", it means that the current erasing operation of the memory block has been completed, and step S260 can be performed.

In step S260, a soft-program operation can be performed on the memory block that has completed the erasing operation, and in step S270, a refresh operation of the memory block can be performed. Next, in step S280, the memory block is set in an accessible state.

Incidentally, the threshold value N can be set by the designer according to the resume number corresponding to when the over-erasing phenomenon may occur in the memory block. This resume number can be known through test operations of performing actual erase operations and repeated suspend operations on the memory block.

Figure 3:
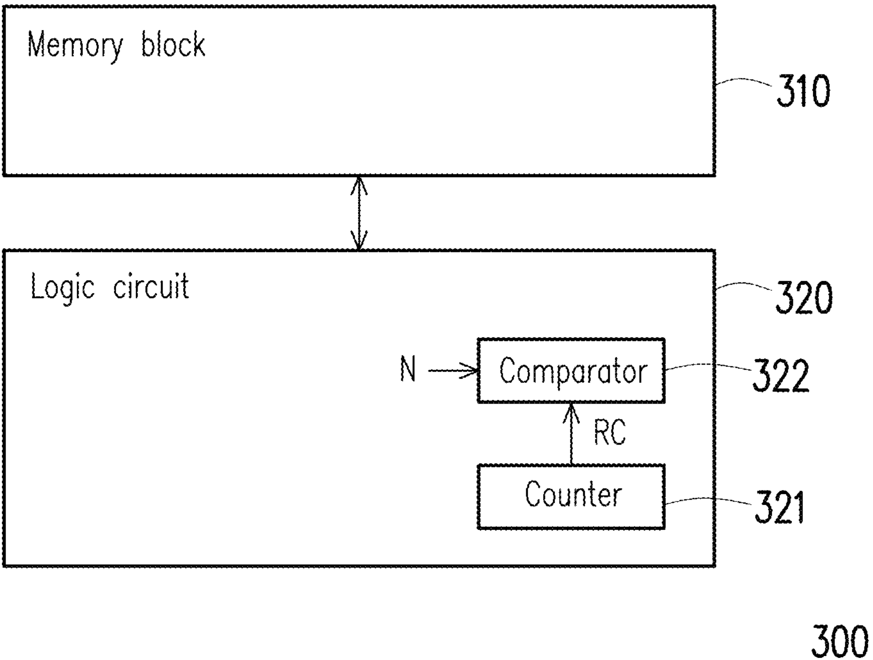
FIG. 3 is a schematic diagram of a memory device of an embodiment of the disclosure.

Referring to FIG. 3, FIG. 3 is a schematic diagram of a memory device of an embodiment of the disclosure. The memory device 300 includes a memory block 310 and a logic circuit 320. The memory block 310 is coupled to the logic circuit 320. The logic circuit 320 is configured to perform each step of the control method of the memory device 300 in FIG. 1 and FIG. 2. Relevant details have been described in detail in the foregoing embodiments, and are not repeated herein.

It is worth mentioning that in this embodiment, the logic circuit 320 may include a counter 321 and a comparator 322. The counter 321 can perform a count operation of a resume number RC of the resume event. The comparator 322 is coupled to the counter 321 and configured to compare the resume number RC with the threshold value N, and perform a soft-program operation according to the comparison result.

In other embodiments of the disclosure, the counter 321 can also be configured to perform a count operation of the suspend number in the suspend event. The comparator 322 can be configured to compare the suspend number with the threshold value N, and perform a soft-program operation according to the comparison result.

The counter 321 and the comparator 322 can be implemented using counting circuits and comparison circuits that are well known to those of ordinary skill in digital circuits, without certain limitations.

It is worth mentioning that the logic circuit 320 can be a state machine circuit. The logic circuit 320 may be implemented using a controller. The controller can perform each step of the control method of the memory device 300 in FIG. 1 and FIG. 2 by executing an application program. The controller can be a hardware circuit designed through a hardware description language (HDL) or any other digital circuit design method known to those with ordinary knowledge in the art, and implemented through a field programmable logic gate array (FPGA), a complex programmable logic device (CPLD), or an application-specific integrated circuit (ASIC).

In summary, the memory device of the disclosure calculates the suspend number or the resume number that occur during the erasing operation of the memory block, and compares the suspend number or the resume number with a predetermined threshold value. When the suspend number or resume number reaches a certain number, the soft-program operation of the memory block is performed. This can reduce the possibility of the over-erasing phenomenon in the memory block and maintain the accuracy of data reading in the memory device.

What is claimed is:

1. A control method of a memory device, comprising:
receiving an erase command and performing an erasing operation on a memory block;
counting a resume number of a plurality of resume events respectively corresponding to a plurality of suspend events or a suspend number of the suspend events when the suspend events occur during the erasing operation;
performing a first soft-program operation on the memory block during the erasing operation when the resume number or the suspend number is greater than or equal to a threshold value; and
resetting the resume number or the suspend number after the first soft-program operation.

2. The control method according to claim 1, further comprising:
initiating a count operation of the resume number or the suspend number during the erasing operation when a first pause event occurs.

3. The control method according to claim 2, further comprising:
incrementing the resume number by 1 in accordance to each of the resume events, or incrementing the suspend number by 1 in accordance to each of the suspend events.

4. The control method according to claim 1, wherein performing the first soft-program operation on the memory block during the erasing operation when the resume number or the suspend number is greater than or equal to the threshold value comprises:
comparing the resume number or the suspend number with the threshold value, and performing the first soft-program operation on the memory block when the resume number or the suspend number is equal to the threshold value.

5. The control method according to claim 1, further comprising:
performing an erase verify operation on the memory block;
completing the erasing operation when a verification result of the erase verify operation is passed; and
continue performing the erasing operation when the verification result of the erase verify operation is a failure.

6. The control method according to claim 5, after completing the erasing operation, further comprising:
performing a second soft-program operation on the memory block.

7. The control method according to claim 6, after completing the erasing operation, further comprising:
performing a refresh operation on the memory block after the second soft-program operation is completed.

8. The control method according to claim 1, further comprising:
performing the first soft-program operation on the memory block by providing a first soft-program voltage to the memory block, wherein the first soft-program voltage is lower than a second soft-program voltage provided to the memory block in the general program operation.

9. The control method according to claim 1, further comprising:
performing the first soft-program operation on the memory block by providing a soft-program voltage with a first pulse width to the memory block, wherein the first pulse width is lower than a second pulse width of the soft-program voltage provided to the memory block in the general program operation.

10. A memory device, comprising:
a memory block; and
a logic circuit, coupled to the memory block, configured to:
receive an erase command and perform an erasing operation on a memory block;
count a resume number of a plurality of resume events respectively corresponding to a plurality of suspend events or a suspend number of the suspend events when the suspend events occur during the erasing operation; and
perform a first soft-program operation on the memory block during the erasing operation when the resume number or the suspend number is greater than or equal to a threshold value,
wherein the logic circuit comprises a counter, the counter is configured to:
reset the resume number or the suspend number after the first soft-program operation.

11. The memory device according to claim 10, wherein the logic circuit is further configured to:
initiate a count operation of the resume number or the suspend number during the erasing operation when a first pause event occurs.

12. The memory device according to claim 11, wherein the counter is further configured to:
increment the resume number by 1 in accordance to each of the resume events, or increment the suspend number by 1 in accordance to each of the suspend events.

13. The memory device according to claim 11, wherein the logic circuit further comprises a comparator, the comparator compares the threshold value with the resume number or the suspend number, and the logic circuit performs the first soft-program operation on the memory block when the resume number or the suspend number is equal to the threshold value.

14. The memory device according to claim 10, wherein the logic circuit is further configured to:
perform an erase verify operation on the memory block;
complete the erasing operation when a verification result of the erase verify operation is passed; and
continue perform the erasing operation when the verification result of the erase verify operation is a failure.

15. The memory device according to claim 10, wherein the logic circuit is further configured to:
perform a second soft-program operation on the memory block after the erasing operation is completed.

16. The memory device according to claim 15, wherein the logic circuit is further configured to:
perform a refresh operation on the memory block after the second soft-program operation is completed.

17. The memory device according to claim 10, wherein the logic circuit is further configured to:

perform the first soft-program operation on the memory block by providing a first programmed energy to the memory block, wherein the first programmed energy is lower than a second programmed energy provided to the memory block in a general program operation.

18. The memory device according to claim 10, wherein the memory block is a non-volatile memory block.

* * * * *